(12) United States Patent
Schulze et al.

(10) Patent No.: US 8,829,562 B2
(45) Date of Patent: Sep. 9, 2014

(54) SEMICONDUCTOR DEVICE INCLUDING A DIELECTRIC STRUCTURE IN A TRENCH

(75) Inventors: Hans-Joachim Schulze, Taufkirchen (DE); Franz Hirler, Isen (DE); Hans-Peter Felsl, Munich (DE); Franz-Josef Niedernostheide, Muenster (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/556,335

(22) Filed: Jul. 24, 2012

(65) Prior Publication Data

US 2014/0027812 A1    Jan. 30, 2014

(51) Int. Cl.
*H01L 29/66* (2006.01)
*H01L 21/336* (2006.01)

(52) U.S. Cl.
CPC ..................................... *H01L 29/66* (2013.01)
USPC ............ 257/139; 257/328; 257/332; 438/259

(58) Field of Classification Search
CPC ....... H01L 29/10; H01L 29/78; H01L 29/772; H01L 29/739
USPC ........... 257/139, 328, 330, 332; 438/268, 259
See application file for complete search history.

(56) References Cited

U.S. PATENT DOCUMENTS

| | | | |
|---|---|---|---|
| 2003/0073287 A1* | 4/2003 | Kocon | 438/259 |
| 2004/0043565 A1* | 3/2004 | Yamaguchi et al. | 438/268 |
| 2005/0151188 A1* | 7/2005 | Nakamura | 257/330 |
| 2006/0065923 A1* | 3/2006 | Pfirsch | 257/328 |
| 2006/0273386 A1* | 12/2006 | Yilmaz et al. | 257/330 |
| 2009/0050959 A1* | 2/2009 | Madson | 257/332 |
| 2010/0006928 A1* | 1/2010 | Pan et al. | 257/330 |

FOREIGN PATENT DOCUMENTS

DE    10240107 B4    3/2008

* cited by examiner

*Primary Examiner* — Long K Tran
*Assistant Examiner* — Dzung Tran
(74) *Attorney, Agent, or Firm* — Murphy, Bilak & Homiller, PLLC

(57) ABSTRACT

A semiconductor device includes a trench extending into a drift zone of a semiconductor body from a first surface. The semiconductor device further includes a gate electrode in the trench and a body region adjoining a sidewall of the trench. The semiconductor device further includes a dielectric structure in the trench. The dielectric structure includes a high-k dielectric in a lower part of the trench. The high-k dielectric includes a dielectric constant higher than that of $SiO_2$. An extension of the high-k dielectric in a vertical direction perpendicular to the first surface is limited between a bottom side of the trench and a level where a bottom side of the body region adjoins the sidewall of the trench.

26 Claims, 6 Drawing Sheets

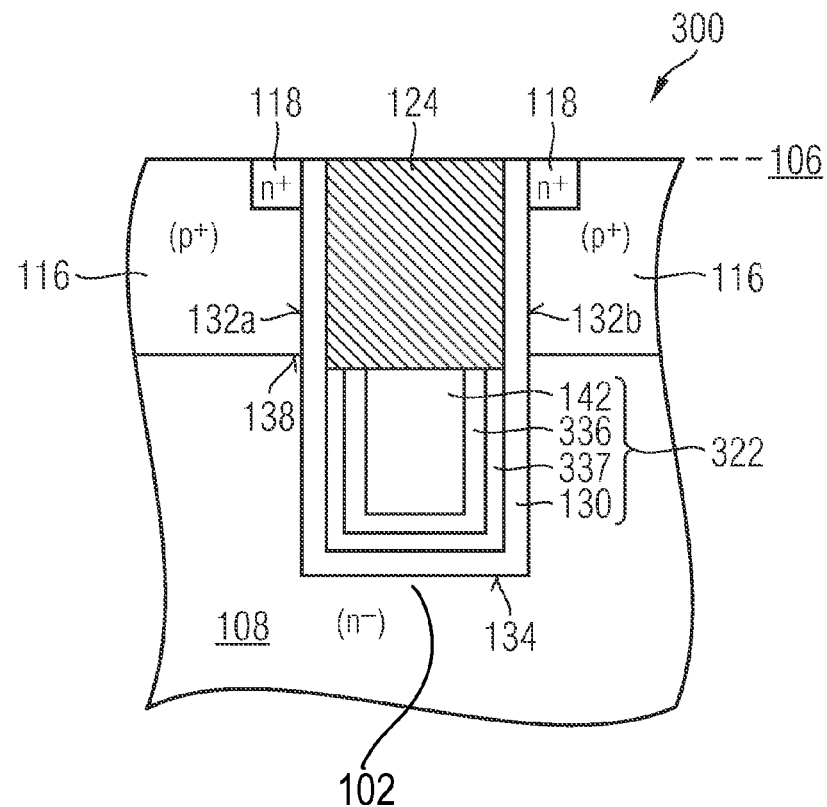
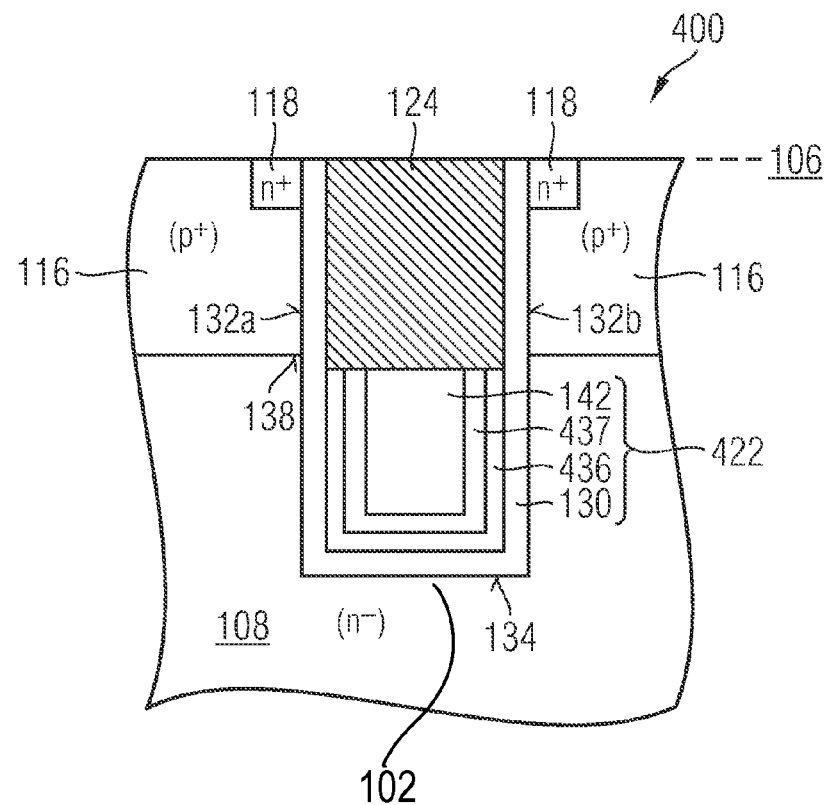

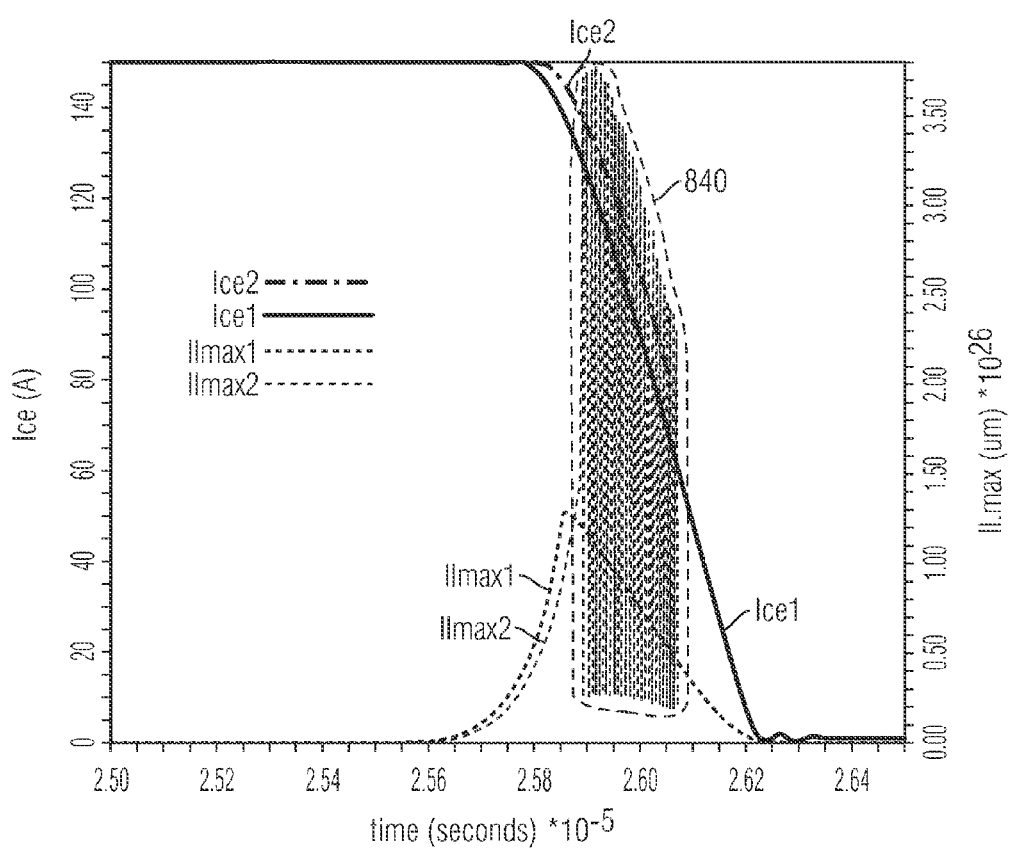

SEMICONDUCTOR DEVICE INCLUDING A DIELECTRIC STRUCTURE IN A TRENCH

BACKGROUND

Field-effect control power switching structures, e.g. insulated gate bipolar transistors (IGBTs) or field effect transistors (FETs), are present in various semiconductor applications including but not limited to switches in power supplies and power converters.

One example of a field-effect control power switching structure is a vertical structure including a gate electrode in a trench. This vertical structure allows current flow between a first side and a second side of a semiconductor die. At or around a bottom of the trenches, high electric fields may lead to a reduction of a breakdown voltage or even destruction of the semiconductor device. As an example, avalanche occurring in a breakdown mode of the semiconductor device may lead to an unstable behavior of the voltage blocking capability of the semiconductor device due to hot carrier generation. This may even lead to a shift of an electrical breakdown region. In case of IGBTs, dynamic avalanche may lead to undesirable oscillations during device turn off. Thereby, a reliability of the semiconductor device can be adversely effected.

It is desirable to improve the reliability of a semiconductor device.

SUMMARY

According to one embodiment of a semiconductor device, the semiconductor device includes a trench extending into a drift zone of a semiconductor body from a first surface. The semiconductor device further includes a gate electrode in the trench. The semiconductor device further includes a body region adjoining a sidewall of the trench. The semiconductor device further includes a dielectric structure in the trench. The dielectric structure includes a high-k dielectric in a lower part of the trench. The high-k dielectric includes a dielectric constant higher than that of $SiO_2$. An extension of the high-k dielectric in a vertical direction perpendicular to the first surface is limited between a bottom side of the trench and a level where a bottom side of the body region adjoins the sidewall of the trench.

According to another embodiment of a semiconductor device, the semiconductor device includes a trench extending into a drift zone of a semiconductor body from a first surface. The semiconductor device further includes a gate electrode in the trench. The semiconductor device further includes a body region adjoining a sidewall of the trench. The semiconductor device further includes a dielectric structure in the trench. The dielectric structure includes a charged dielectric in a lower part of the trench. A surface charge of the charged dielectric ranges between 10 $cm^{-2}$ and $10^{13}$ $cm^{-2}$. An extension of the charged dielectric in a vertical direction perpendicular to the first surface is limited between a bottom side of the trench and a level where a bottom side of the body region adjoins the sidewall of the trench.

Those skilled in the art will recognize additional features and advantages upon reading the following detailed description, and upon viewing the accompanying drawings.

BRIEF DESCRIPTION OF THE DRAWINGS

The accompanying drawings are included to provide a further understanding of the present invention and are incorporated in and constitute a part of this specification. The drawings illustrate embodiments of the present invention and together with the description serve to explain principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts. The features of the various illustrated embodiments can be combined unless they exclude each other.

Embodiments are depicted in the drawings and are detailed in the description which follows.

FIG. 3 is a cross-sectional view of another embodiment of a dielectric structure in a lower part of the trench of the semiconductor device illustrated in FIG. 1A, wherein the dielectric structure includes a high-k dielectric on a charged dielectric.

FIG. 4 is a cross-sectional view of another embodiment of a dielectric structure in a lower part of the trench of the semiconductor device illustrated in FIG. 1A, wherein the dielectric structure includes a charged dielectric on a high-k dielectric.

FIG. 8 illustrates a comparison of device parameters when turning off a reference device and a semiconductor device including a charged dielectric in a lower part of a trench similar to FIG. 2.

DETAILED DESCRIPTION

Figure 1A:
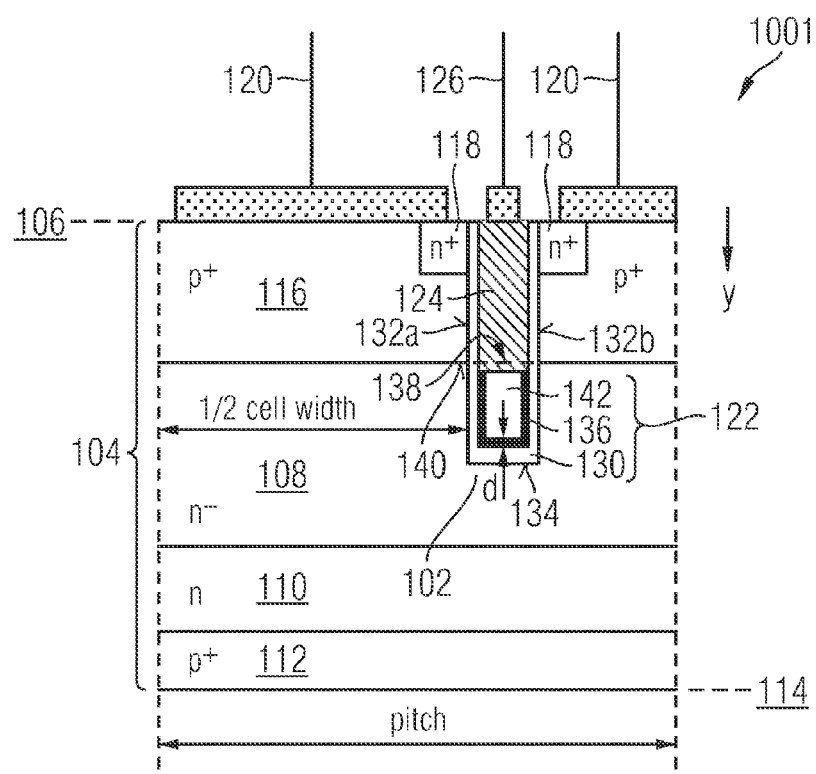
FIGS. 1A to 1C are a schematic cross-sectional views of different transistor cell designs of one embodiment of a semiconductor device including a high-k dielectric in a lower part of a trench.

In the following detailed description, reference is made to the accompanying drawings, which form a part hereof, and in which is shown by way of illustration specific embodiments in which the invention may be practiced. In this regard, directional terminology, such as "top", "bottom", "front", "back", "leading", "trailing", "over", "above", "below", etc., is used with reference to the orientation of the Figure(s) being described. Because components of the embodiments can be positioned in a number of different orientations, the directional terminology is used for purposes of illustration and is in no way limiting. It is to be understood that other embodiments may be utilized and structural or logical changes may be made without departing from the scope of the present invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements or manufacturing processes have been designated by the same references in the different drawings if not stated otherwise.

The terms "lateral" and "horizontal" as used in this specification intends to describe an orientation parallel to a first surface of a semiconductor substrate or semiconductor body. This can be for instance the surface of a wafer or a die.

The term "vertical" as used in this specification intends to describe an orientation which is arranged perpendicular to the first surface of the semiconductor substrate or semiconductor body.

As employed in this specification, the terms "coupled" and/or "electrically coupled" are not meant to mean that the elements must be directly coupled together—intervening elements may be provided between the "coupled" or "electrically coupled" elements. The term "electrically connected" intends to describe a low-ohmic electric connection between the elements electrically connected together.

In this specification, n-doped may refer to a first conductivity type while p-doped is referred to a second conductivity type. It goes without saying that the semiconductor devices can be formed with opposite doping relations so that the first conductivity type can be p-doped and the second conductivity type can be n-doped. Furthermore, some Figures illustrate relative doping concentrations by indicating "−" or "+" next to the doping type. For example, "$n^-$" means a doping concentration which is less than the doping concentration of an "n"-doping region while an "$n^+$"-doping region has a larger doping concentration than the "n"-doping region. Indicating the relative doping concentration does not, however, mean that doping regions of the same relative doping concentration have the same absolute doping concentration unless otherwise stated. For example, two different n+ regions can have different absolute doping concentrations. The same applies, for example, to an $n^+$ and a $p^+$ region.

Specific embodiments described in this specification pertain to, without being limited thereto, power semiconductor devices which are controlled by field-effect and particularly to unipolar devices such as MOSFETs.

The term "field-effect" as used in this specification intends to describe the electric field mediated formation of an "inversion channel" and/or control of conductivity and/or shape of the inversion channel in a semiconductor channel region.

FIG. 1A illustrates a schematic cross-section of an IGBT 1001 according to an embodiment. The IGBT 1001 includes a trench 102 extending into a semiconductor body 104 from a first side 106, e.g. an emitter side.

The semiconductor body 104 includes an $n^-$-type drift zone 108, e.g. a semiconductor substrate such as a silicon substrate. The semiconductor body 104 further includes an optional n-type field stop region 110 and a $p^+$-doped emitter 112 at a second side 114 opposite to the first side 106, e.g. at a collector side. The optional n-doped field stop region 110 is located between the $n^-$-doped drift zone 108 and the $p^+$-doped emitter region 112. $P^+$-doped body regions 116 acting as an IGBT emitter and $n^+$-doped source regions 118 adjoin the first side 106 and are electrically coupled to a first contact 120, e.g. a source contact, respectively.

The trench 102 includes a dielectric structure 122 and a gate electrode 124 electrically coupled to a second contact 126, e.g. a gate contact.

The dielectric structure 122 in the trench 102 includes a first dielectric 130 lining sidewalls 132a, 132b and a bottom side 134 of the trench 102. The dielectric structure 122 further includes a high-k dielectric 136 in a lower part of the trench. The high-k dielectric includes a dielectric constant higher than that of $SiO_2$, e.g. higher than 3.9. An extension of the high-k dielectric 136 in a vertical direction y perpendicular to the first surface 106 is limited between the bottom side 134 of the trench 102 and a level 138 where a bottom side 140 of the body regions 116 adjoins the sidewall 132a of the trench 102. In the illustrated embodiment, the high-k dielectric 136 lines a part of the first dielectric 130 at sidewalls 132a, 132b and at the bottom side 134 of the trench 102.

A second dielectric 142 is formed on the high-k dielectric 136. In other words, the high-k dielectric 136 is sandwiched between the first dielectric 130 and the second dielectric 142. According to another embodiment, the second dielectric 142 is replaced by an electrode. As an example, the gate electrode 124 may extend into an area of the second dielectric 142 illustrated in FIG. 1A. According to another example, the second dielectric 142 is replaced by a field electrode and a dielectric between the gate electrode 124 and the field electrode. A further dielectric or dielectric layer stack may be arranged between the field electrode and the high-k dielectric 136.

As an example, the first dielectric 130 may constitute a gate dielectric between the gate electrode 124 and the $p^+$-doped body regions 116 in a channel region between the $n^+$-doped source zones 118 and the $n^-$-doped drift zone 108. As an example, the first dielectric 130 may include or be made of $SiO_2$, e.g. a thermal oxide. The first dielectric 130 may also be appropriately chosen with regard to prevention of a chemical reaction between a material of the semiconductor body 104 and the high-k dielectric 136. As a further example, the second dielectric 142 may include or correspond to an oxide and/or a nitride.

According to one embodiment, the high-k dielectric 136 includes at least one of $Al_2O_3$, $Ta_2O_3$ and $ZrO_2$. According to an embodiment, a thickness d of the high-k dielectric 136 ranges between 50 nm and 1 µm.

In the illustrated embodiment, $n^+$-doped source zones 118 and $p^+$-doped body regions 116 adjoin opposing sidewalls 132a, 132b of the trench 102. The cross-sectional view of the IGBT 1001 illustrates only a part of an IGBT cell array. As an example, a geometry of the IGBT cells may be in the form of stripes including trenches 102 extending in parallel to each other. As a further example, a geometry of the trenches 102, i.e. when viewed from above, may be in the shape of a polygon, e.g. a square and/or a hexagon. Polygonal trenches may be arranged in a regular pattern, e.g. in a regular grid.

The $p^+$-doped emitter region 112 at the second side 114 may be formed by implanting p-type dopants into the semiconductor body 104 from the second side 114. Likewise, the optional n-doped field stop zone 110 may also be formed by implanting n-type dopants into the semiconductor body 104 from the second side 114.

The illustrated semiconductor device 1001 is an IGBT including the high-k dielectric 136 in the trench 102. According to another embodiment, the high-k dielectric 136 may also be included in the trench 102 of another semiconductor device, e.g. a FET having an $n^+$-doped drain contact region at the second side 114 instead of the $p^+$-doped emitter region 112 illustrated in FIG. 1A.

Formation of the high-k dielectric 136 in the lower part of the trench 102 allows to substantially reduce an electric field strength in an area around a bottom part of the trench 102. This allows to reduce undesirable oscillations during IGBT or FET turn off.

Figure 1B:
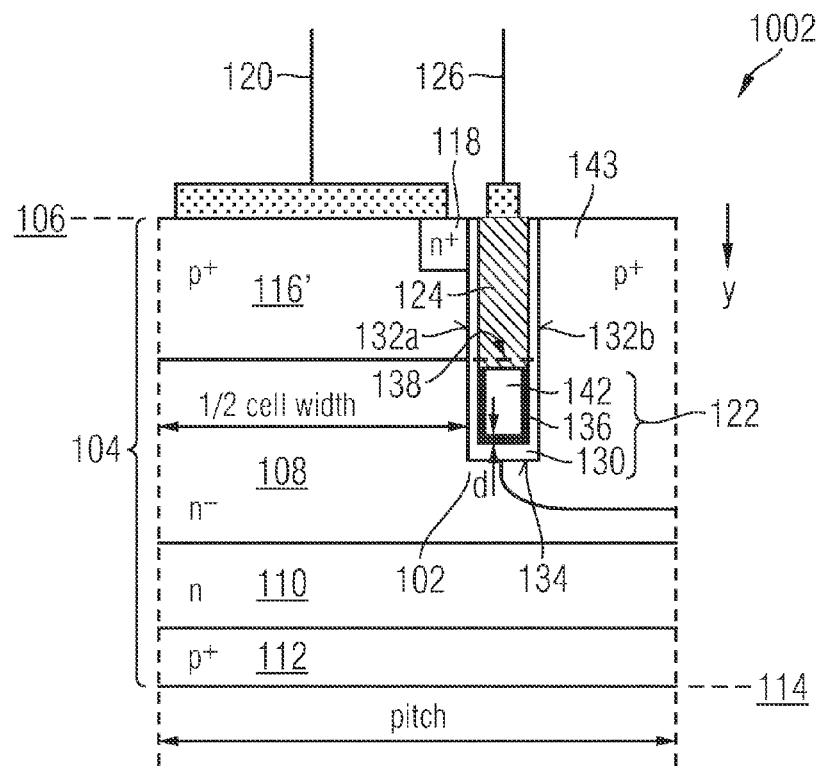

FIG. 1B illustrates a schematic cross-sectional view of an IGBT 1002 that includes the dielectric structure 122 in the trench 102 similar to the IGBT 1001 illustrated in FIG. 1A, but differs from the IGBT 1001 with regard to a cell geometry. Where the body region 116 of the IGBT 1001 adjoins opposite sidewalls 132a, 132b of the trench 102, a body region 116' of the IGBT 1002 illustrated in FIG. 1B adjoins the sidewall 132a, but is absent at a side of the sidewall 132b. A floating p$^+$-doped region 143 adjoins the first side 106 and lines the sidewall 132b as well as a part of the bottom side 134 of the trench 102.

Figure 1C:
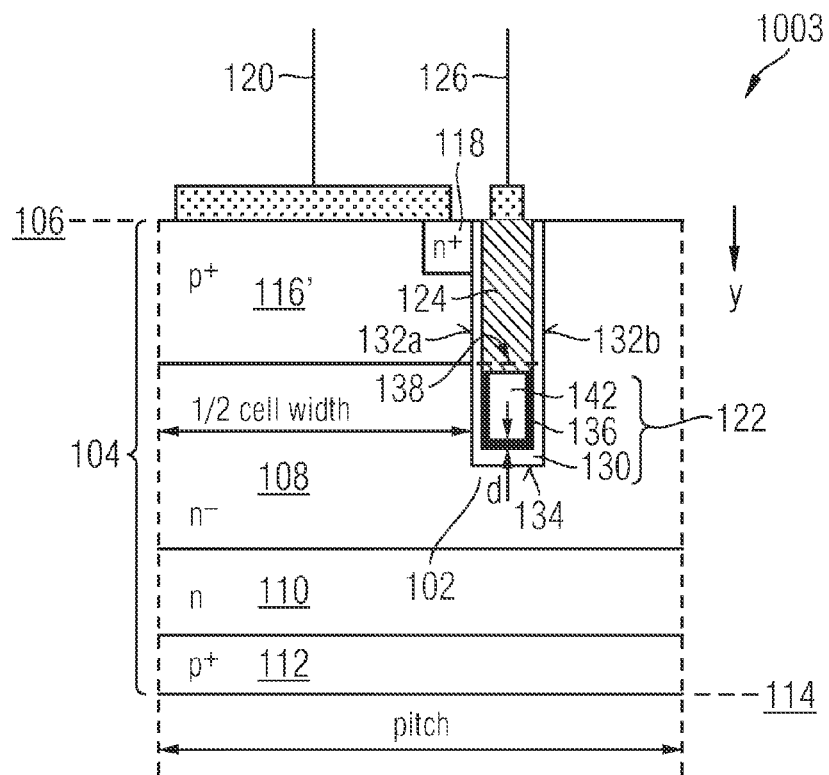

FIG. 1C illustrates a schematic cross-sectional view of an IGBT 1003 that includes the dielectric structure 122 in the trench 102 similar to the IGBT 1001 illustrated in FIG. 1A, but differs from the IGBT 1001 with regard to a cell geometry. Where the body region 116 of the IGBT 1001 adjoins opposite sidewalls 132a, 132b of the trench 102, a body region 116' of the IGBT 1002 illustrated in FIG. 1B adjoins the sidewall 132a, but is absent at a side of the sidewall 132b.

Figure 2:
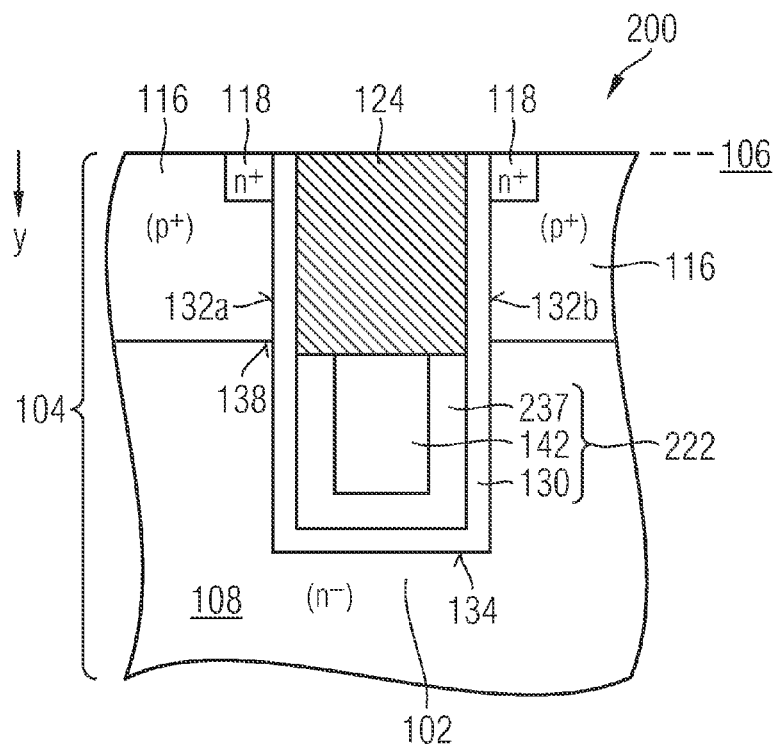
FIG. 2 illustrates a cross-sectional view of another embodiment of a dielectric structure in a lower part of the trench of the semiconductor device illustrated in FIG. 1A, wherein the dielectric structure includes a charged dielectric.

FIG. 2 illustrates a schematic cross-sectional view of a semiconductor device 200 in an area around a trench 102. Similar to the IGBT 1001 illustrated in FIG. 1A, the semiconductor device 200 includes the n$^-$-doped drift zone 108, the p$^+$-doped body region 116 acting as an IGBT emitter and the n$^+$-doped source zone 118. The first dielectric 130 of a dielectric structure 222 lines the sidewalls 132a and 132b as well as the bottom side 134 of the trench 102. The first dielectric 130 constitutes a gate dielectric in an upper part of the trench 102 between the n$^+$-doped source zone 118 and the n$^-$-doped drift zone 108. The dielectric structure 222 further includes a charged dielectric 237 in the lower part of the trench 102. A surface charge of the charged dielectric 237 amounts to at least $10^{11}$ cm$^{-2}$, or to at least $5 \times 10^{11}$ cm$^{-2}$, or to at least $1 \times 10^{12}$ cm$^{-2}$. Additionally and as a further example, the surface charge of the charged dielectric 237 is less than $10^{13}$ cm$^{-2}$. An extension of the charged dielectric 237 in the vertical direction y perpendicular to the first surface 106 is limited between the bottom side 134 of the trench 102 and a level 138 where a bottom side of the body region 116 adjoins the sidewall 132a of the trench 102.

According to an embodiment, the charged dielectric 237 includes a negative charge. As an example the charged dielectric 237 includes cesium (Cs). According to one embodiment, the charged dielectric 237 includes a net negative charge. According to another embodiment, the charged dielectric 237 includes a net positive charge.

According to one embodiment, the charged dielectric 237 is formed by nitriding an oxide layer, e.g. by thermal annealing in an ambient including NH$_3$. According to another embodiment, formation of the charged dielectric 237 includes adding cesium ions to this layer. Adding of cesium ions may be achieved by doping the dielectric with cesium and/or by a cesium precursor layer. The cesium precursor layer may be formed by atomic layer deposition (ALD) or by immersing the semiconductor body 104 into a solution including cesium ions, e.g. a CsCl solution.

The charged dielectric 237 lines the first dielectric 130 at the sidewalls 132a in the lower part of the trench including the bottom side 134.

The charged dielectric structure 222 further includes a second dielectric 142 on the charged dielectric 237. In other words, the charged dielectric 237 is sandwiched between the first dielectric 130 and the second dielectric 142.

The trench 102 further includes the gate electrode 124 on the charged dielectric 237 and on the second dielectric 142. The gate electrode 124 is electrically insulated from the p$^+$-doped body region and the n$^+$-doped source zone by the first dielectric 130.

Similar to the high-k dielectric 136 of the IGBTs illustrated in FIGS. 1A to 1C, formation of the charged dielectric 237 in the lower part of the trench 102 also allows to substantially reduce an electric field strength in an area around a bottom part of the trench 102, thereby reducing undesirable oscillations during IGBT or FET turn off.

FIG. 3 illustrates a schematic cross-sectional view of a semiconductor device 300 in an area around a trench 102. Similar to the semiconductor device 200 illustrated in FIG. 2, the semiconductor device 300 includes the n$^-$-doped drift zone 108, the p$^+$-doped body region 116 acting as an IGBT emitter and the n$^+$-doped source zone 118. The first dielectric 130 of an insulating structure 322 lines the sidewalls 132a and 132b as well as the bottom side 134 of the trench 102. The first dielectric 130 constitutes a gate dielectric in an upper part of the trench 102 between the n$^+$-doped source zone 118 and the n$^-$-doped drift zone 108. The dielectric structure 322 further includes a charged dielectric 337 in the lower part of the trench 102. A surface charge of the charged dielectric 337 amounts to at least $10^{11}$ cm$^{-2}$, or to at least $5 \times 10^{11}$ cm$^{-2}$, or to at least $1 \times 10^{12}$ cm$^{-2}$. As a further example, the surface charge of the charged dielectric 337 is less than $10^{13}$ cm$^{-2}$. An extension of the charged dielectric 337 in the vertical direction y perpendicular to the first surface 106 is limited between the bottom side 134 of the trench 102 and a level 138 where the bottom side of the body region 116 adjoins the sidewall 132a of the trench 102.

According to an embodiment, the charged dielectric 337 includes a negative charge. As an example the charged dielectric 337 includes cesium (Cs). According to one embodiment, the charged dielectric 337 includes a net negative charge. According to another embodiment, the charged dielectric 337 includes a net positive charge.

According to one embodiment, the charged dielectric 337 may be formed by nitriding an oxide layer, e.g. by thermal annealing in an ambient including NH$_3$. According to another embodiment, formation of the charged dielectric 337 including adding of cesium ions to this layer. Adding of cesium ions may be achieved by doping the dielectric with cesium and/or by a cesium precursor layer. The cesium precursor layer may be formed by atomic layer deposition (ALD) or by immersing the semiconductor body 104 into a solution including cesium ions, e.g. a CsCl solution.

The charged dielectric 337 lines the first dielectric 130 at the sidewalls 132a in the lower part of the trench and at the bottom side 134.

The dielectric structure 322 further includes a high-k dielectric 336 on the charged dielectric 337 in the lower part of the trench 102. The high-k dielectric 336 includes a dielectric constant higher than that of SiO$_2$, e.g. higher than 3.9. An extension of the high-k dielectric 336 in a vertical direction y perpendicular to the first surface 106 is limited between a bottom side 134 of the trench 102 and a level 138 where a bottom side of the body regions 116 adjoins the sidewall 132a of the trench 102.

The dielectric structure 322 further includes a second dielectric 142. In other words, the charged dielectric 337 and the high-k dielectric 336 are sandwiched between the first dielectric 130 and the second dielectric 142. An intermediate dielectric may be arranged between the high-k dielectric 336 and the charged dielectric 337.

The trench 102 further includes the gate electrode 124 on the charged dielectric 337, the high-k dielectric 336 and the second dielectric 142. The gate electrode 124 is electrically insulated from the p+-doped body region 116 and the n+-doped source zone 118 by the first dielectric 130.

FIG. 4 illustrates a schematic cross-sectional view of a semiconductor device 400 in an area around a trench 102. Similar to the semiconductor device 200 illustrated in FIG. 2, the semiconductor device 400 includes the n−-doped drift zone 108, the p+-doped body region 116 acting as an IGBT emitter and the n+-doped source zone 118. The first dielectric 130 of a dielectric structure 422 lines the sidewalls 132a and 132b as well as the bottom side 134 of the trench 102. The first dielectric 130 constitutes a gate dielectric in an upper part of the trench 102 between the n+-doped source zone 118 and the n−-doped drift zone 108. The dielectric structure 422 further includes a high-k dielectric 436 in the lower part of the trench. The high-k dielectric 436 includes a dielectric constant higher than that of $SiO_2$, e.g. higher than 3.9. An extension of the high-k dielectric 436 in a vertical direction y perpendicular to the first surface 106 is limited between a bottom side 134 of the trench 102 and a level 138 where a bottom side of the body regions 116 adjoins the sidewall 132a of the trench 102.

The high-k dielectric 436 lines the first dielectric 130 at the sidewalls 132a in the lower part of the trench 102 and at the bottom side 134.

The dielectric structure 422 further includes a charged dielectric 437 on the high-k dielectric 436 in the lower part of the trench 102. A surface charge of the charged dielectric 437 amounts to at least $10^{11}$ cm$^{-2}$ or to at least $5 \times 10^{11}$ cm$^-$cm$^{-2}$, or to at least $1 \times 10^{12}$ cm$^{-2}$. As a further example, the surface charge of the charged dielectric 437 is less than $10^{13}$ cm$^{-2}$. An extension of the charged dielectric 437 in the vertical direction y perpendicular to the first surface 106 is limited between the bottom side 134 of the trench 102 and a level 138 where the bottom side of the body region 116 adjoins the sidewall 132a of the trench 102.

According to an embodiment, the charged dielectric 437 includes a negative charge. As an example the charged dielectric includes cesium (Cs). According to one embodiment, the charged dielectric 437 includes a net negative charge. According to another embodiment, the charged dielectric 437 includes a net positive charge.

According to one embodiment, the charged dielectric 437 is formed by nitriding an oxide layer, e.g. by thermal annealing in an ambient including $NH_3$. According to another embodiment, formation of the charged dielectric 437 including adding of cesium ions to this layer. Adding of cesium ions may be achieved by doping the dielectric with cesium and/or by a cesium precursor layer. The cesium precursor layer may be formed by atomic layer deposition (ALD) or by immersing the semiconductor body 104 into a solution including cesium ions, e.g. a CsCl solution.

The dielectric structure 422 further includes a second dielectric 142. In other words, the high-k dielectric 436 and the charged dielectric 437 are sandwiched between the first dielectric 130 and the second dielectric 142. An intermediate dielectric may be arranged between the high-k dielectric 436 and the charged dielectric 437.

The trench 102 further includes the gate electrode 124 on the high-k dielectric 436, the charged dielectric 437 and the second dielectric 142. The gate electrode 124 is electrically insulated from the p+-doped body region 116 and the n+-doped source 118 zone by the first dielectric 130.

Figure 5:
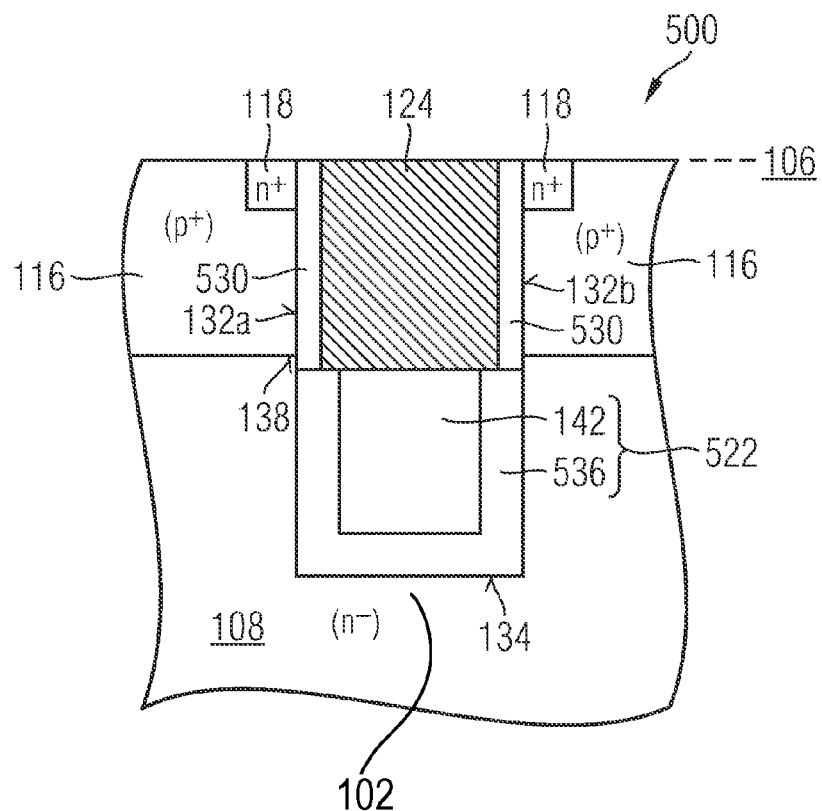
FIG. 5 is a cross-sectional view of another embodiment of a dielectric structure in a lower part of the trench of the semiconductor device illustrated in FIG. 1A, wherein the dielectric structure includes a high-k dielectric lining opposing sidewalls and a bottom side of the lower part of the trench.

FIG. 5 illustrates a schematic cross-sectional view of a semiconductor device 500 in an area around a trench 102. Similar to the semiconductor device 200 illustrated in FIG. 2, the semiconductor device 500 includes the n−-doped drift zone 108, the p+-doped body region 116 acting as an IGBT emitter and the n+-doped source zone 118. The semiconductor device 500 includes a dielectric structure 522. The dielectric structure 522 includes a high-k dielectric 536 adjoining and lining the sidewalls 132a and 132b as well as the bottom side 134 of the trench 102. The high-k dielectric 536 includes a dielectric constant higher than that of $SiO_2$, e.g. higher than 3.9. An extension of the high-k dielectric 536 in a vertical direction y perpendicular to the first surface 106 is limited between a bottom side 134 of the trench 102 and a level 138 where a bottom side of the body regions 116 adjoins the sidewall 132a of the trench 102. The dielectric structure 522 further includes a gate dielectric 530 in an upper part of the trench 102 between the n+-doped source zone 118 and the n−-doped drift zone 108.

The dielectric structure 522 further includes a second dielectric 142 on the high-k dielectric 536. The trench 102 further includes the gate electrode 124 on the high-k dielectric 536 and the second dielectric 142. The gate electrode 124 is electrically insulated from the p+-doped body region 116 and the n+-doped source zone 118 by the gate dielectric 530.

According to another embodiment, the high-k dielectric 536 is replaced by a charged dielectric including properties similar to the charged dielectric 237 illustrated in FIG. 2. According to yet another embodiment, the high-k dielectric 536 is replaced by a stack of a high-k dielectric and a charged dielectric.

Figure 6:
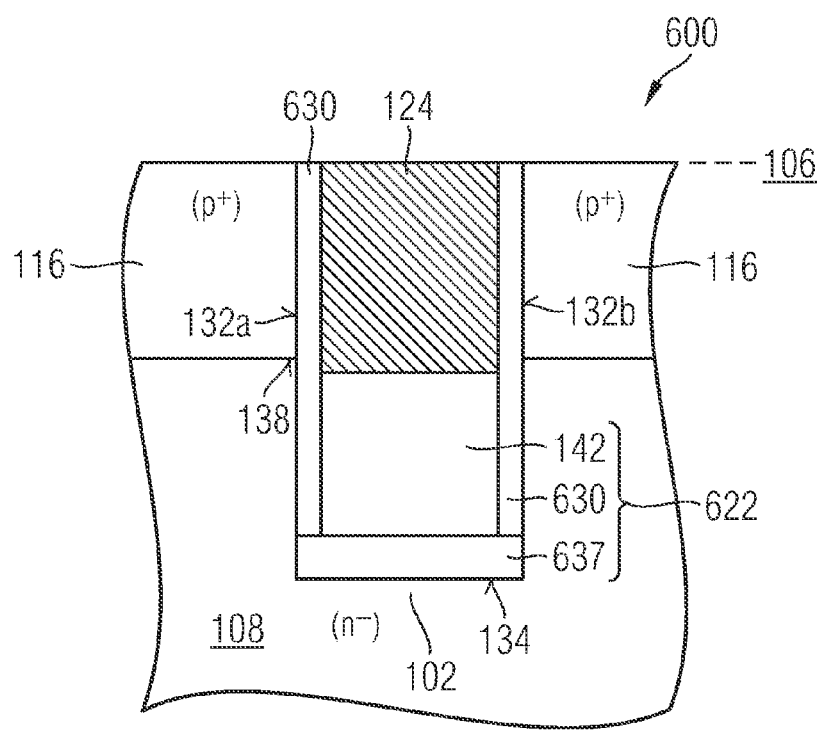
FIG. 6 is a cross-sectional view of another embodiment of a dielectric structure in a lower part of the trench of the semiconductor device illustrated in FIG. 1A, wherein, the dielectric structure partly fills the lower part of the trench at a bottom side of the trench.

FIG. 6 illustrates a schematic cross-sectional view of a semiconductor device 600 in an area around a trench 102. Similar to the semiconductor device 200 illustrated in FIG. 2, the semiconductor device 600 includes the n−-doped drift zone 108, the p+-doped body region 116 acting as an IGBT emitter and the n+-doped source zone 118.

The semiconductor device 600 includes a dielectric structure 622. The dielectric structure 622 includes a high-k dielectric 637 filling up a bottom part of the trench 102. The high-k dielectric 637 adjoins the bottom side 134 of the trench 102 a bottom part of the sidewalls 132a, 132b. The high-k dielectric 637 includes a dielectric constant higher than that of $SiO_2$, e.g. higher than 3.9. An extension of the high-k dielectric 637 in a vertical direction y perpendicular to the first surface 106 is limited between a bottom side 134 of the trench 102 and a level 138 where a bottom side of the body region 116 adjoins the sidewall 132a of the trench 102. According to one embodiment, the high-k dielectric 637 extends from the bottom side 134 of the trench 102 up to a level between 10% to 80% or up to a level between 10% and 50% of a distance from the bottom side 134 of the trench 102 to the level 138 where the bottom side 140 of the body region 116 adjoins the sidewall 132a of the trench 102.

The dielectric structure 622 further includes a first dielectric 630 lining a part of the sidewalls 132a, 132b above the high-k dielectric 637. The first dielectric 630 constitutes a gate dielectric in an upper part of the trench 102 between the n+-doped source zone 118 and the n−-doped drift zone 108. The dielectric structure 622 further includes a second dielectric 142 on the high-k dielectric 637. The trench 102 further includes the gate electrode 124 on the high-k dielectric 636 and the second dielectric 142. The gate electrode 124 is electrically insulated from the p+-doped body region 116 and the n+-doped source zone 118 by the gate dielectric 630.

According to another embodiment, the high-k dielectric 637 is replaced by a charged dielectric including properties similar to the charged dielectric 237 illustrated in FIG. 2. According to yet another embodiment, the high-k dielectric 637 is replaced by a stack of a high-k dielectric and a charged dielectric.

Formation of the high-k dielectric and/or charged dielectric in the lower part of the trench 102 as described in the embodiments above allows to substantially reduce an electric field strength in an area around a bottom part of the trench 102. This allows to reduce undesirable oscillations during IGBT or FET turn off.

In the embodiments illustrated in FIGS. 1A to 6, the semiconductor devices include a gate electrode in a trench. According to other embodiments, one, two, three or even more field electrodes may be arranged in the trench. As an example, the field electrode(s) may be arranged between a bottom side of the gate electrode and a bottom side of the trench. The field electrode(s) may be electrically insulated from the gate electrode via a dielectric structure in the trench. In case of numerous field electrodes in the trench, the dielectric structure may also electrically insulate separate field electrodes.

Similar to the embodiments described above with reference to FIGS. 1A to 1C, the second dielectric 142 of the embodiments illustrated in FIGS. 2 to 6 may also be replaced by an electrode. As an example, the gate electrode 124 may extend into an area of the second dielectric 142. According to another example, the second dielectric 142 is replaced by a field electrode and a dielectric between the gate electrode 124 and the field electrode.

Figure 7:
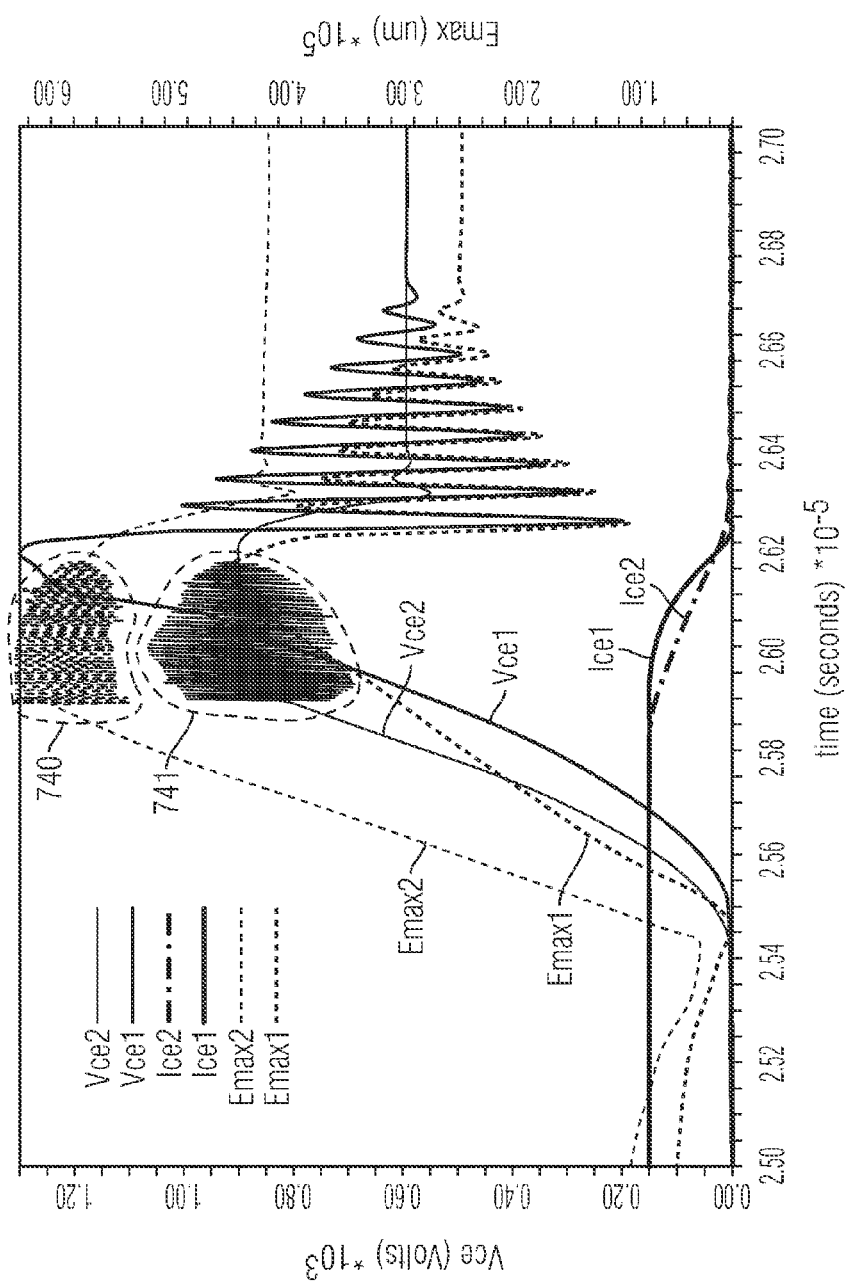
FIG. 7 schematically illustrates a comparison of device parameters when turning off a reference device and a semiconductor device including a high-k dielectric in a lower part of a trench similar to FIG. 1A.

FIG. 7 schematically illustrates simulated characteristics of a first IGBT including a high-k dielectric in a trench similar to the embodiments illustrated in FIGS. 1A to 1C and a reference IGBT lacking the high-k dielectric in the trench. In the simulation a value of the static relative permittivity $\in_r$ (also called dielectric constant) of 50 was used.

The electric characteristics of the first and second IGBTs are illustrated on the basis of a same scale for each parameter. The schematic diagram illustrates transients of collector current Ice1 (first IGBT), Ice2 (reference IGBT) versus time t during turning-off the IGBT. Further illustrated characteristics are collector-emitter voltage Vce1 (first IGBT), Vce2 (reference IGBT) and maximum electric field strength Emax1 (first IGBT), Emax2 (reference IGBT). In the reference device so-called dynamic clamping oscillations occur during turning-off. These dynamic clamping oscillations are framed by dashed line 740 with regard to the maximum electric field strength Emax2 and by dashed line 741 with regard to the collector-emitter voltage Vce2. Dynamic clamping oscillations are undesirable since these oscillations can cause electromagnetic disturbance. As an extreme example, the dynamic clamping oscillations may lead to device destruction. In the first IGBT based on an embodiment, dynamic clamping oscillations do not emerge due to reduced dynamic avalanche arising from the high-k dielectric in the lower part of the trench. As can be gathered from the characteristics illustrated in FIG. 7 a peak of the maximum electric field strength Emax1 of the first IGBT according to an embodiment is substantially lower than a peak of the maximum electric field strength Emax2 of the reference IGBT despite the higher maximum collector-emitter voltage Vce1.

FIG. 8 schematically illustrates simulated characteristics of a first IGBT including a negatively charged dielectric in a trench similar to the embodiment illustrated in FIG. 2 and a reference IGBT lacking the charged dielectric in the trench.

The electric characteristics of the first and second IGBTs are illustrated on the basis of a same scale for each parameter. The schematic diagram illustrates transients of collector current Ice1 (first IGBT), Ice2 (reference IGBT) versus time t during turning-off the IGBT. Another illustrated characteristic refers to a maximum avalanche generation rate Ilmax1 (first IGBT), Ilmax2 (reference IGBT). In the reference device so-called dynamic clamping oscillations occur during turning-off. These dynamic clamping oscillations are framed by dashed line 840. Dynamic clamping oscillations are undesirable since these oscillations can cause electromagnetic disturbance. As an extreme example, the dynamic clamping oscillations may lead to device destruction. In the first IGBT based on an embodiment, dynamic clamping oscillations do not emerge due to reduced dynamic avalanche arising from the charged dielectric in the lower part of the trench. As can be gathered from the characteristics illustrated in FIG. 8 the maximum avalanche generation rate Ilmax1 of the first IGBT according to an embodiment is substantially lower than the maximum avalanche generation rate Ilmax2 of the reference IGBT.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
    a trench extending into a drift zone of a semiconductor body from a first surface;
    a gate electrode in the trench;
    a body region adjoining a sidewall of the trench;
    a dielectric structure in the trench, the dielectric structure directly adjoining the semiconductor body along the bottom of the trench, and the dielectric structure including a high-k dielectric in a lower part of the trench, wherein the high-k dielectric includes a dielectric constant higher than that of $SiO_2$; and wherein an extension of the high-k dielectric in a vertical direction perpendicular to the first surface is limited between a bottom side of the trench and a level where a bottom side of the body region adjoins the sidewall of the trench; and wherein the high-k dielectric is spaced from the bottom side of the trench along the vertical direction by a portion of the dielectric structure including a first dielectric layer.

2. The semiconductor device of claim 1, wherein the high-k dielectric includes at least one of $Al_2O_3$, $Ta_2O_5$, and $ZrO_2$.

3. The semiconductor device of claim 1, wherein a thickness of the dielectric ranges between 50 nm and 1 μm.

4. The semiconductor device of claim 1, further comprising a field electrode in the trench below the gate electrode.

5. The semiconductor device of claim 1, wherein the high-k dielectric lines opposing sidewalls and a bottom side of the trench.

6. The semiconductor device of claim 1, wherein the high-k dielectric is sandwiched between the first dielectric layer and a second dielectric layer.

7. The semiconductor device of claim 1, wherein the first dielectric is between the high-k dielectric and the semiconductor body.

8. The semiconductor device of claim 7, wherein the first dielectric includes $SiO_2$.

9. The semiconductor device of claim 1, wherein the dielectric structure further includes a charged dielectric in a lower part of the trench, wherein a surface charge of the charged dielectric ranges between $10^{11}$ cm$^{-2}$ and $10^{13}$ cm$^{-2}$; and wherein an extension of the charged dielectric in a vertical direction perpendicular to the first surface is limited between a bottom side of the trench and a level where a bottom side of the body region adjoins the sidewall of the trench.

10. The semiconductor device of claim 9, wherein the charged dielectric adjoins the high-k dielectric.

11. The semiconductor device of claim 9, wherein an intermediate dielectric is between the high-k dielectric and the charged dielectric.

12. The semiconductor device of claim 9, wherein the charged dielectric includes a negative charge.

13. The semiconductor device of claim 12, wherein the charged dielectric includes cesium.

14. The semiconductor device of claim 1, wherein the semiconductor device is an Insulated Gate Bipolar Transistor.

15. The semiconductor device of claim 1, wherein the semiconductor device is a Field Effect Transistor.

16. The semiconductor device of claim 1, wherein the extension of the high-k dielectric in a vertical direction perpendicular to the first surface is limited between the bottom side of the trench and a level between 10% to 50% of a distance from the bottom side of the trench to the level where the bottom side of the body region adjoins the sidewall of the trench.

17. A semiconductor device, comprising:
a trench extending into a drift zone of a semiconductor body from a first surface;
a gate electrode in the trench;
a body region adjoining a sidewall of the trench;
a dielectric structure in the trench, the dielectric structure including a charged dielectric in a lower part of the trench, wherein a net charge of the dielectric corresponds to a surface charge of the charged dielectric ranging between $10^{11}$ cm$^{-2}$ and $10^{13}$ cm$^{-2}$; and wherein an extension of the charged dielectric in a vertical direction perpendicular to the first surface is limited between a bottom side of the trench and a level where a bottom side of the body region adjoins the sidewall of the trench.

18. The semiconductor device of claim 17, wherein the charged dielectric lines opposing sidewalls and the bottom side of the trench.

19. The semiconductor device of claim 17 wherein the charged dielectric includes a negative charge.

20. The semiconductor device of claim 19, wherein the charged dielectric includes cesium.

21. The semiconductor device of claim 17, wherein the charged dielectric is sandwiched between a first dielectric layer and a second dielectric layer.

22. The semiconductor device of claim 17, wherein a first dielectric is between the charged dielectric and the semiconductor body.

23. The semiconductor device of claim 17, wherein the dielectric structure further includes a high-k dielectric in a lower part of the trench, wherein the high-k dielectric includes a dielectric constant higher than that of $SiO_2$; and wherein an extension of the high-k dielectric in a vertical direction perpendicular to the first surface is limited between a bottom side of the trench and a level where a bottom side of the body region adjoins the sidewall of the trench.

24. The semiconductor device of claim 23, wherein the charged dielectric adjoins the high-k dielectric.

25. The semiconductor device of claim 23, wherein an intermediate dielectric is between the high-k dielectric and the charged dielectric.

26. The semiconductor device of claim 17, wherein the extension of the charged dielectric in a vertical direction perpendicular to the first surface is limited between the bottom side of the trench and a level between 10% to 50% of a distance from the bottom side of the trench to the level where the bottom side of the body region adjoins the sidewall of the trench.

* * * * *